July 9, 1957 M. W. BANG 2,798,897

SHIELD FOR PRINTED WIRING

Filed May 11, 1953

INVENTOR.
MOGENS W. BANG

BY Darby & Darby
ATTORNEYS

United States Patent Office 2,798,897

Patented July 9, 1957

2,798,897

SHIELD FOR PRINTED WIRING

Mogens W. Bang, Montclair, N. J., assignor to Allen B. Du Mont Laboratories, Inc., Clifton, N. J., a corporation of Delaware Application May 11, 1953, Serial No. 354,357

5 Claims. (Cl. 174—35)

This invention relates to shields for electrical circuits, and particularly to shields suitable for use with electrical circuits of the type known as printed circuits or wiring.

Printed wiring circuits comprise electrically conductive members which are printed on, or otherwise impressed upon a board or strip made from electrically insulative material. Printed wiring may comprise electrical coils or inductances, which are usually in the form of loops or spirals of electrically conductive material impressed upon the surface of the supporting strip. Certain portions of printed wiring circuits, and particularly printed inductances in high-gain circuits, must be electrically shielded to prevent undesirable electrical interaction effects. In the past, it has been difficult or impossible to provide economical and efficient electrical shielding of printed wiring circuits.

Objects of the present invention are to provide electrical shielding of printed wiring, and to do so with an economical and effective structure. Other objects will be apparent.

Figure 1:
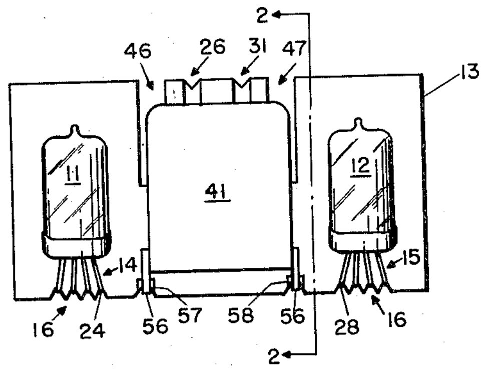
Fig. 1 is a side elevational view of a preferred embodiment of the invention.
Figure 2:
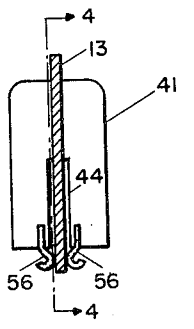
Fig. 2 is a cross-sectional view taken on the line 2—2 of Fig. 1.
Figure 3:
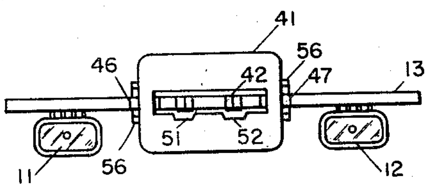
Fig. 3 is a top view of the structure shown in Fig. 1.
Figure 4:
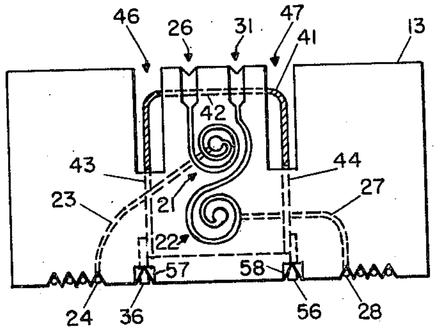
Fig. 4 is a cross-sectional view taken on the line 4—4 of Fig. 2.

The preferred embodiment of the invention is shown as comprising an intermediate amplifier strip containing amplifier tubes 11, 12 suitably attached to an insulative strip or support plate 13, adjacent one side or surface thereof, by connecting for instance, the leads 14, 15 thereof to the support plate 13 by means of notches 16 and by employing a dip soldering technique as described in co-pending patent application Serial Number 538,038 filed May 28, 1953 by the same inventor and assigned to the same assignee. Electrical tuned circuits, shown as comprising a spiral shaped primary inductance 21 and a spiral shaped secondary inductance 22, may be printed on or otherwise attached to the side or surface of the support strip 13. The center of the primary spiral 21 is shown as being connected by means of a printed conductor 23, positioned on the other side of the support strip 13, to a lead, such as, for instance, an anode lead 24 of the tube 11. The outer end of the primary spiral 21 terminates at a connection slot 26, as shown.

The central end of the secondary spiral inductance 22 is shown as being connected by means of an electrical printed conductor 27, attached to the said other side of the strip 13, to an input or control grid lead 28 of the amplifier tube 12. The remaining end of the secondary spiral winding 22 terminates at a connection slot 31, as shown. The connector slots 26 and 31 provide for dip-soldering connections to circuit components or to other printed wiring strips as is described in the above mentioned co-pending patent application.

The electrical printed conductors 23, 27 may be connected to the coils 21, 22 by means of rivets, or the like, extending through the support strip 13. The printed primary 21 and secondary 22 are spaced a proper distance from each other so as to provide electrical field coupling therebetween.

In accordance with the invention, the coils 21 and 22, which comprise a coupling transformer, are electrically shielded by means of a shield 41 provided with an open lower end and with an elongated slot 42 in the upper closed end thereof. Elongated slots 43, 44 extend upwardly along the sides from the lower edge thereof.

The support strip 13 is provided with slots 46, 47, extending inwardly from the upper edge thereof. The shield 41 is positioned onto the strip 13 so as to substantially surround the coils 21, 22 as shown, the slots 43—46 and 44, 47, mutually providing for the positioning thereof.

The slot 42 in the upper end of the shield 41 may be provided with widened portions 51, 52 in the vicinity of the coil connector slots 26, 31 to insure adequate clearance for electrical insulation. The lower end of the shield 41 may be open as mentioned or may be closed except for an elongated slot or opening therein for permitting the shield to be positioned on the support strip 13 as has been described. When the shield 41 is in position, the edges of the openings therein will flank the sides of the support strip 13.

The shield 41 may be provided with extensions or tabs 56 extending downwardly from the lower end thereof at the sides. These tabs 56 may be in the form of clamping springs which clamp over the lower edge of the insulator strip 13, thereby holding the shield 41 in place. Alternatively, the tabs 56 may engage printed conductors 57, 58 and may be dip-soldered thereto, thus providing a firm anchorage of the shield 41 to the support strip 13. The conductors 57, 58 may be at electrical ground potential, thereby electrically grounding the shield.

The invention provides for efficient and economical assembly of a shielded printed circuit. The desired components may be positioned on the support strip 13 and the shield 41 may be placed in its proper position, whereupon the edges of the assembly are dip-soldered. Thus, the dip-soldering operation solders all electrical connections and also solders the shield in place as mentioned above. To accomplish dip-soldering of both the upper and lower edges of the strip 13, it is preferable that the shield be sufficiently short in height so that the dip-soldering of the edges of the strip 13 will not necessitate dipping any portion of the shield into the solder. Due to the slot 42 in the upper end of the shield, certain connections, such as the connections 26, 31, may be dip-soldered at the upper edge of the support strip 13. The novel shield provides efficient electrical shielding at reduced cost and utilizes a minimum of space.

While a preferred embodiment of the invention has been shown and described, various modifications thereof will occur to those skilled in the art, but such modifications and embodiments of the invention may be made within the scope thereof as defined in the following claims.

What is claimed is:

1. A shielded electrical circuit comprising a support strip, a pair of mutually parallel slots in said support strip extending inwardly from an edge thereof, an electrical circuit supported on said strip substantially between said slots, and a shield can having an opening in the lower end thereof and openings in the sides thereof extending upwardly from said lower end opening, said shield being positioned to surround substantially said electrical circuit, the edges of said side openings flanking the sides of said support strip, said sides of said shield can being positioned respectively in said parallel slots.

2. The shielded circuit in accordance with claim 1, including a support tab extending from said shield can and engaging said support strip, whereby said shield can may be electrically grounded and securely fastened by dip-soldering.

3. The shielded circuit in accordance with claim 1, including an opening across in the upper end of said shield, said shield being positioned so that a portion of said support strip extends through said upper end opening, whereby electrical connections on said support strip may be made by dip-soldering.

4. The shielded circuit in accordance with claim 3, in which said shield can is shorter in height than the height of said support strip, whereby the upper and lower edges of said support strip extend beyond the confines of said shield can, whereby electrical connections on said supports strip may be made by dip-soldering.

5. A shielded electrical circuit comprising a support strip, a pair of mutually parallel slots in said support strip extending inwardly from an edge thereof, an electrical circuit supported on said strip substantially between said slots, and a shield can positioned to surround substantially said electrical circuit, opposite sides of said shield can being positioned respectively in said parallel slots, whereby said shield can may be easily slipped over said support strip and said circuit.

References Cited in the file of this patent

UNITED STATES PATENTS

| | | |
|---|---|---|
| 1,647,474 | Seymour | Nov. 1, 1927 |
| 2,454,018 | Wagstaff | Nov. 16, 1948 |
| 2,474,988 | Sargrove | July 5, 1949 |
| 2,488,710 | Cooper | Nov. 22, 1949 |
| 2,593,479 | Nieter | Apr. 22, 1952 |

FOREIGN PATENTS

| | | |
|---|---|---|
| 806,975 | Germany | June 21, 1951 |